US012802776B2

(12) United States Patent
Alu et al.

(10) Patent No.: US 12,802,776 B2
(45) Date of Patent: Nov. 17, 2026

(54) STABLE STATE ERROR-HANDLING BIN SELECTION IN MEMORY DEVICES

(71) Applicant: Micron Technology, Inc., Boise, ID (US)

(72) Inventors: Taylor Alu, Boise, ID (US); Nicola Ciocchini, Boise, ID (US); Shyam Sunder Raghunathan, Woodlands (SG); Guang Hu, Mountain View, CA (US); Walter Di Francesco, Avezzano (IT); Umberto Siciliani, Rubano (IT); Violante Moschiano, Avezzano (IT); Karan Banerjee, Singapore (SG)

(73) Assignee: Micron Technology, Inc., Boise, ID (US)

( * ) Notice: Subject to any disclaimer, the term of this patent is extended or adjusted under 35 U.S.C. 154(b) by 171 days.

(21) Appl. No.: 18/440,619

(22) Filed: Feb. 13, 2024

(65) Prior Publication Data

US 2025/0006292 A1 Jan. 2, 2025

Related U.S. Application Data

(60) Provisional application No. 63/446,728, filed on Feb. 17, 2023.

(51) Int. Cl.

| | |
|---|---|
| ***G11C 29/52*** | (2006.01) |
| ***G11C 16/20*** | (2006.01) |
| ***G11C 16/34*** | (2006.01) |

(52) U.S. Cl.
CPC .............. *G11C 29/52* (2013.01); *G11C 16/20* (2013.01); *G11C 16/3418* (2013.01)

(58) Field of Classification Search
CPC ...................................................... G11C 29/52
See application file for complete search history.

(56) References Cited

U.S. PATENT DOCUMENTS

| | | | | |
|---|---|---|---|---|
| 2003/0035336 | A1* | 2/2003 | Terzioglu ................. | G11C 7/06 365/230.03 |
| 2005/0052913 | A1* | 3/2005 | Brox .................... | G11C 7/1078 365/202 |
| 2015/0049548 | A1* | 2/2015 | Park ................... | G11C 16/3427 365/185.11 |
| 2015/0085571 | A1* | 3/2015 | Hu ...................... | G11C 11/5642 365/185.21 |
| 2019/0043585 | A1* | 2/2019 | Banerjee ............ | G11C 16/0433 |
| 2019/0243704 | A1* | 8/2019 | Muchherla ......... | G11C 16/3459 |
| 2021/0183851 | A1 | 6/2021 | Davis et al. | |
| 2022/0164263 | A1 | 5/2022 | Liikanen et al. | |

* cited by examiner

*Primary Examiner* — Douglas King
(74) *Attorney, Agent, or Firm* — Brooks, Cameron & Huebsch, PLLC

(57) ABSTRACT

A method includes detecting a change in a memory control signal of a memory device including memory blocks, determining based at least on the change in the memory control signal that the memory device is in a stable state, and responsive to determining that the memory device is in the stable state, associating a voltage offset bin with at least one memory block of the memory device.

18 Claims, 6 Drawing Sheets

STABLE STATE ERROR-HANDLING BIN SELECTION IN MEMORY DEVICES

PRIORITY INFORMATION

This Application claims the benefit of U.S. Provisional Application No. 63/446,728, filed on Feb. 17, 2023, the contents of which are incorporated herein by reference.

TECHNICAL FIELD

Embodiments of the disclosure are generally related to memory sub-systems, and more specifically, are related to stable state error-handling bin selection in memory devices.

BACKGROUND

A memory sub-system can include one or more memory devices that store data. The memory devices can be, for example, non-volatile memory devices and volatile memory devices. In general, a host system can utilize a memory sub-system to store data at the memory devices and to retrieve data from the memory devices.

BRIEF DESCRIPTION OF THE DRAWINGS

The present disclosure will be understood more fully from the detailed description given below and from the accompanying drawings of various embodiments of the disclosure.

DETAILED DESCRIPTION

Figure 1:
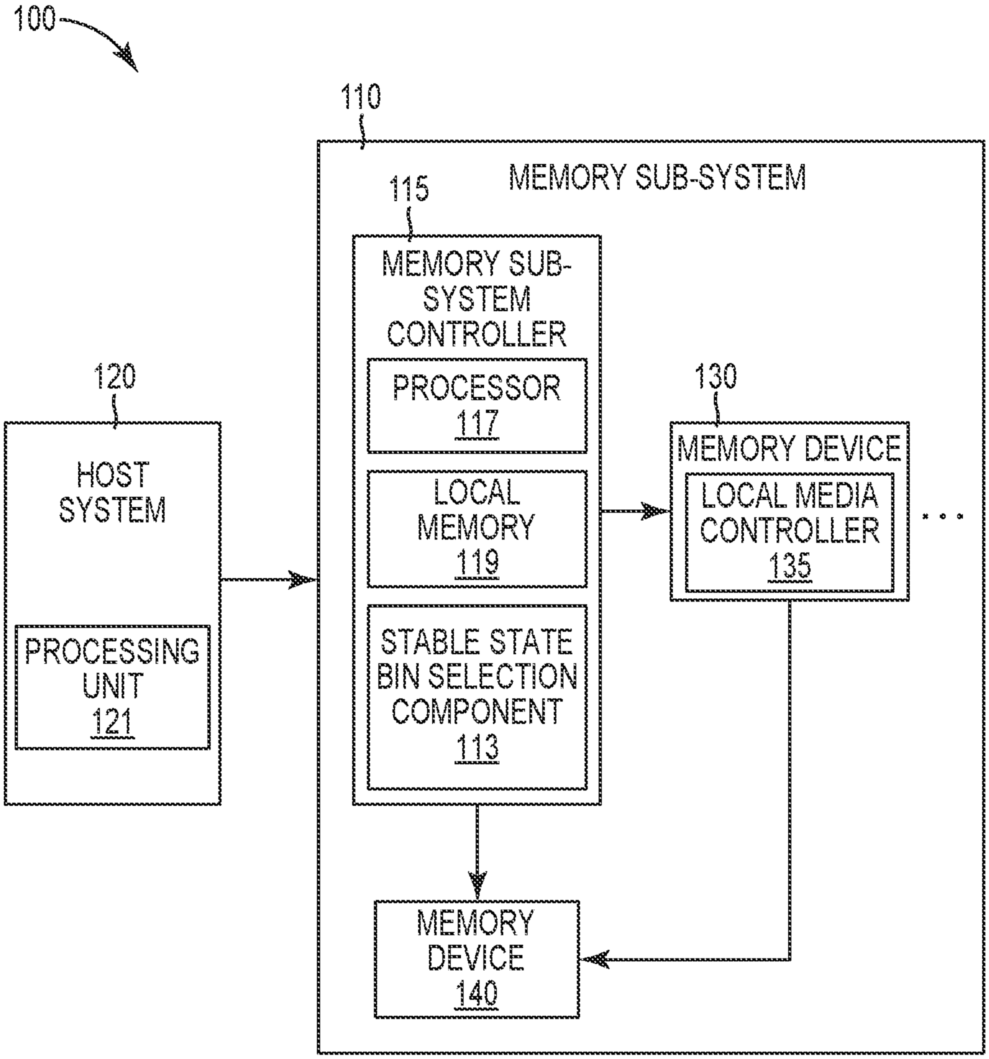
FIG. 1 illustrates an example of a computing system that includes a memory sub-system in accordance with some embodiments of the present disclosure.

Aspects of the present disclosure are directed to stable state error-handling bin selection in memory devices and, in particular, to memory sub-systems that include a stable state error-handling bin selection component. A memory sub-system can be a storage system, storage device, a memory module, or a combination of such. An example of a memory sub-system is a storage system such as a solid-state drive (SSD). Examples of storage devices and memory modules are described below in conjunction with FIG. 1, et alibi. In general, a host system can utilize a memory sub-system that includes one or more components, such as memory devices that store data. The host system can provide data to be stored at the memory sub-system and can request data to be retrieved from the memory sub-system.

A memory sub-system can include high density non-volatile memory devices where retention of data is desired when no power is supplied to the memory device. One example of non-volatile memory devices is a negative-and (NAND) memory device. Other examples of non-volatile memory devices are described below in conjunction with FIG. 1. A non-volatile memory device is a package of one or more dies. Each die can consist of one or more planes. For some types of non-volatile memory devices (e.g., NAND devices), each plane consists of a set of physical blocks. Each block consists of a set of pages. Each page consists of a set of memory cells ("cells"). A cell is an electronic circuit that stores information. Depending on the cell type, a cell can store one or more bits of binary information, and has various logic states that correlate to the number of bits being stored. The logic states can be represented by binary values, such as "0" and "1", or combinations of such values.

Data operations can be performed by the memory sub-system. The data operations can be host-initiated operations. For example, the host system can initiate a data operation (e.g., write, read, erase, etc.) on a memory sub-system. The host system can send access requests (e.g., write command, read command) to the memory sub-system, such as to store data on a memory device at the memory sub-system and to read data from the memory device on the memory sub-system. The data to be read or written, as specified by a host request, is hereinafter referred to as "host data". A host request can include logical address information (e.g., logical block address (LBA), namespace) for the host data, which is the location the host system associates with the host data. The logical address information (e.g., LBA, namespace) can be part of error handling data and/or metadata for the host data.

A memory device includes multiple memory cells, each of which can store, depending on the memory cell type, one or more bits of information. A memory cell can be programmed (written to) by applying a certain voltage to the memory cell, which results in an electric charge being held by the memory cell, thus allowing modulation of the voltage distributions of the memory cell. Moreover, precisely controlling the amount of the electric charge stored by the memory cell allows establishment of multiple threshold voltage levels corresponding to different logical levels, thus effectively allowing a single memory cell to store multiple bits of information: a memory cell operated with $2^{nd}$ different threshold voltage levels is capable of storing n bits of information.

"Threshold voltage" herein shall refer to the voltage level that defines a boundary between two neighboring voltage distributions corresponding to two logical levels. Thus, the read operation can be performed by comparing the measured threshold voltage exhibited by the memory cell to one or more reference voltage levels in order to distinguish between two logical levels for single-level cells and between multiple logical levels for multi-level cells. A voltage distribution is the distribution of threshold voltages within a set of NAND cells.

The threshold voltage of a memory cell changes in time as the electric charge of the cell is degrading, which is referred to as "temporal voltage shift (TVS)" (since the degrading electric charge causes the voltage distributions to shift along the voltage axis towards lower voltage levels). TVS is the change in the measured voltage of cells as a function of time. TVS may include different components such as intrinsic charge loss, system charge loss, quick charge loss, etc. TVS is generally increased by Program Erase Cycles (PEC), higher temperatures, and higher program voltages. TVS may show significant die-to-die variation. Failure to mitigate the temporal voltage shift can result in an increased bit error rate in read operations.

Moreover, the memory system may have different performance characteristics depending on whether the memory system is in a stable state or a transient state. For instance, error-handling bin (e.g., bin) selection may vary depending on whether the memory system is in a stable state or a transient state. Stated differently, the memory system may experience different degrees of differences in TVS depending on whether the memory system is in a stable state or a transient state.

As used herein, a "stable state" refers to an operational state of a memory system at a time that is greater than a threshold amount of time subsequent to an occurrence of a most recent memory operation (e.g., a read or write operation) associated with the memory system. When in the stable state, any residual pass voltages, etc. previously applied to a conducting line (e.g., a global word line (GWL) and/or word line (WL) in the memory system may have had a sufficient amount of time to fully dissipate. For example, when sufficient time (e.g., 10 microseconds to 100 microseconds) passes after last read operation, a channel in the memory system may reach 0 V, for instance due to an electrical connection to a source GND plate. A memory system may be in a stable state after the memory system is initially powered-up prior to any memory operations (e.g., a read operation) occurring that involve the memory system.

As used herein, a "transient state" refers to an operational state of a memory system at a time that is less than or equal to a threshold amount of time subsequent to an occurrence of a most recent memory operation associated with the memory system. When in the transient state, any residual pass voltages, etc. may not have had a sufficient amount of time to fully dissipate. For example, during repeated read operations, a channel may have a negative voltage compared to a GND reference, for instance due to capacitive coupling to WL gates. A memory system may be in a transient state during typical operation of the memory system in which the memory system is powered-up and various memory operations involving the memory system are being performed and/or have been recently performed.

Previous approaches may not address the differences in TVS depending on whether the memory device is in given operational state (e.g., a stable state, etc.) or may attempt to address the differences in TVS with strategies that result in high bit error rates and/or impart latency into operation of the memory device. For instance, some previous approaches may not determine whether a memory system is in a stable state or a transient state. Thus, such approaches may initially select a first bin when the memory system is in a given state (e.g., an stable state following a power-up event) that is not suitable for operation of the memory system in another state (e.g., a transient state). Such approaches may exhibit high error rates during transient state operation and/or may result in time-consuming and/or computationally expensive re-selection of a different bin once the memory system changes from a first operational state (e.g., a stable state) to a second operational state (e.g., a transient state).

Accordingly, other approaches may seek to cause the memory system to enter a transient state during and/or prior to bin selection. Such approaches can ensure that the memory system is in a typical operating state (e.g., a transient state) and thereby select a bin that is suitable for the typical operating state of the memory device. Yet, such approaches can inherently impart latency, increase computational overhead, and/or increase bus traffic etc. For instance, such approaches may utilize a dummy read (e.g., a read in which resultant data is not decoded) to force a memory array in a memory device to enter a transient state before performing a bin scan (e.g., a BFEA scan) and/or may change a type of LDPC decoding from a high reliability (HRD) to a high efficiency type. For example, changing the type of LDPC decoding forces the memory system to perform read error handling (REH) steps and thus the memory system enters a transient state. However, forcing the memory system to perform REH steps imparts performance degradation/delay.

Embodiments of the present disclosure address the above-noted and other deficiencies by implementing a memory sub-system that employs stable state error-handling bin selection in memory devices associated with the memory sub-system. For instance, stable state error-handling bin selection in accordance with aspects of the disclosure can be performed in the absence of a dummy read and yet can detect and account for a stable state of a memory system and/or memory sub-system. As such, approaches herein permit for "proper" bin selection that accounts for a given operational state of a memory sub-system without imparting any additional latency (e.g., in the absence of a dummy read) to yield accurate read level offsets and thus exhibit lower trigger rates for data recovery sequences in comparison to the approaches described above. Various approaches herein can utilize determination of a memory control signal change during a BFEA scan (e.g., a first BFEA scan following a power-up event of a memory system) to detect and account for a stable state of a memory system without imparting any additional latency on the memory system, as detailed herein.

As used herein, a "block" shall refer to a set of contiguous or non-contiguous memory pages. An example of "block" is "erasable block," which is the minimal erasable unit of memory, while "page" is a minimal writable unit of memory. Each page includes a set of memory cells. A memory cell is an electronic circuit that stores information.

As used herein, a "block family" shall refer to a possibly noncontiguous set of memory cells (which can reside in one or more full and/or partial blocks, the latter referred to as "partitions" herein) that have been programmed within a specified time window and a specified temperature window, and thus are expected to exhibit similar or correlated changes in their respective data state metrics. A block family may be made with any granularity, containing only whole codewords, whole pages, whole super pages, or whole superblocks, or any combination of these.

As used herein, a "superblock" is a set of data blocks that span multiple memory dice that are written in an interleaved fashion. In some cases, a superblock may span all the die within an SSD. A superblock may contain multiple data blocks from a single die, such as one per plane. Drives may generally manage the erasure and programming of data on a superblock basis. A drive is a data storage device containing NAND. Examples of drives are SSDs, mobile storage drives, hybrid drives, etc. Generally speaking, a host is a computer that interfaces to the drive and a system is the host and the drive taken together.

As used herein, a "data state metric" is a quantity that is measured or inferred from the state of data stored on a memory device. Specifically, the data state metrics may reflect the state of the TVS, the degree of read disturb, and/or other measurable functions of the data state. A composite data state metric is a function (e.g., a weighted sum) of a set of component state metrics.

Block Family Creation is the process of opening a block family, maintaining that open block family for a duration, and then closing that block family. Opening a block family starts the Open Block Family Tenure, a time during which the drive may write data to the block family or my read data from the block family. Closing a block family starts the Closed Block Family Tenure, a time during which the drive may read data from the block family but not write data to the block family. Invalidating the block family starts the Invalid Block Family Tenure, a time during which the block family contains no data which has not been rendered invalid, normally through garbage collection. The open block family tenure and the closed block family tenure together are the Block Family Tenure.

As used herein, "Block Family Error Avoidance (BFEA)" is an algorithm that tracks TVS to keep each block/superblock or pages within a block/superblock calibrated well enough to have an acceptable Bit Error Rate (BER) and Trigger Rate during the block family tenure. A Dynamic Tracking Block (DTB) is a set of cells that is written for the purpose of tracking the degree of TVS or for inferring an amount of time that has passed, such as when performing a re-synchronization ("resync").

The TVS may be selectively tracked for programmed blocks grouped by block families, and appropriate voltage offsets, which are based on block affiliation with a certain block family, are applied to the base read levels in order to perform read operations. A read level is a voltage position. Read levels are numbered in increasing voltage from L1 through 2 {circumflex over ( )} (number of bits). As an example, for TLC, the read levels would be L1, L2, . . . , L7.

As used herein, a "read level value" is a voltage or digital-to-analog converter (DAC) value representing a voltage that is applied to the read element (often, the control gate for a NAND cell) for purposes of reading that cell.

As used herein, a "read level offset" is a component of the equation that determines the read level value. Offsets may be summed (i.e., read level value=offset_a+offset_b+ . . . ). By convention, one of the read level offsets may be called the read level base.

As used herein, a "base read level" is the initial threshold voltage level exhibited by the memory cell immediately after programming. In some implementations, base read levels can be stored in the metadata of the memory device.

The memory sub-system controller can perform a calibration process in order to associate each die of every block family with one of the predefined threshold voltage offset bins, which is in turn associated with the voltage offset to be applied for read operations. Calibration is altering a read level value (possibly by adjusting a read level offset or read level base) to better match the ideal read levels for a read or set of reads. The associations of blocks with block families and block families and dies with threshold voltage offset bins can be stored in respective metadata tables maintained by the memory sub-system controller.

As used herein, an "error-handling bin", "bin", or "BFEA bin" is a set of read level offsets that are applied to a set of data. The bin offsets are read level offsets that affect the read level for block families within the bin. In this context, a bin is usually primarily directed at addressing TVS, but may also be directed at other mechanisms. An older bin is one where the read levels offsets are directed at data that was written at a relatively early time. A young or younger bin is one where the read levels are directed at data written relatively recently. An old or older bin is one where the read levels are directed at data written relatively recently. The read level adjustments may be implemented through either offsets or read retries, or even as an adjustment to the base. Bin selection is the process by which the drive bin selects which bin to use for a given read.

Upon receiving a read command, the memory sub-system controller can identify the block family associated with the block identified by the logical block address (LBA) specified by the read command, identify the threshold voltage offset bin associated with the block family and die on which the block resides, compute the new threshold voltage by additively applying the threshold voltage offset associated with the threshold voltage offset bin to the base read level, and perform the read operation using the new threshold voltage, as described in more detail herein below. Notably, the threshold voltage offset bin associated with the block family can be determined based on whether the system is in a stable state or a transient state, as detailed herein.

The memory sub-system can experience down states, including power down states for periods of time that are sufficient for the voltage bin associations of family blocks to become stale during the slow charge loss that was continuously happening during such a power down state. Furthermore, the memory sub-system may not register the power down state time and/or may lose the real-time clock during the power down state. Accordingly, when the memory sub-system is powered up after a power down state, it may not always compute the duration of the power down state in order to adjust the voltage bin assignments. Therefore, the memory sub-system should perform calibration operations (also referred to as scan operations) in order to adjust the voltage bin assignments for the block families that are defined in the memory sub-system.

Upon the power up event, it is desirable to complete the adjustments of voltage bin assignments within the shortest time possible. Aspects and embodiments of the present disclosure address this problem by determination of whether the memory system is in a stable state (e.g., following the power up event) and accounting for the system being in the stable state in the absence of a dummy read. Thus, the approaches herein can provide efficient bin re-synchronization ("resync") following a power up event for minimizing errors in subsequent read operations. Upon detecting a power up event, the memory sub-system controller can initiate re-synchronization of the stored voltage bin associations. In accordance with aspects of the present disclosure, the re-synchronization involves applying temporal voltage shift (TVS)-oriented calibration procedures, since the TVS is presumed to be the dominant voltage distortion mechanism during power down states.

Accordingly, the memory sub-system controller can perform scan of the memory device, account for the system being in a stable state following the power-down state, and re-synchronization of pointers of the block families based on the acquired data state metric values (e.g., bit error rate). The scan can involve performing, with respect to selected blocks within a block family that is being scanned, read operations utilizing different threshold voltage offsets to select the threshold voltage offset that accounts for the memory system being in the stable state and that optimizes a chosen data state metric (e.g., minimizes the bit error rate of the read operations). The TVS-specific calibration procedures may involve utilizing the voltage offsets that correspond to voltage offset bins defined in the memory sub-system, e.g., a voltage offset bin that is immediately adjacent to the voltage offset bin that has been assigned to the block family before the power down event. In some implementations, the voltage offsets utilized for the calibration operations can have higher granularity than the voltage offsets associated with the voltage offset bins defined in the memory sub-system.

Furthermore, in some implementations, the calibration operations may be performed with an emphasis on the lowest voltage offset bins, since they are more likely to have moved to new bins during a power off state, as described in detail herein below.

Therefore, advantages of the systems and methods implemented in accordance with some embodiments of the present disclosure include, but are not limited to, improving the bit error rate in read operations by maintaining metadata tracking groups of blocks (block families) that are presumed to exhibit similar voltage distributions and selectively performing calibration operations for limited subsets of blocks based on their block family association that can account for a stable state of a memory device, as described herein. These and other aspects of the present disclosure therefore improve the overall function of a computing device or computing system in which the memory sub-system and/or memory devices described herein operate.

FIG. 1 illustrates an example computing system 100 that includes a memory sub-system 110 in accordance with some embodiments of the present disclosure. The memory sub-system 110 can include media, such as one or more volatile memory devices (e.g., memory device 140), one or more non-volatile memory devices (e.g., memory device 130), or a combination of such.

A memory sub-system 110 can be a storage device, a memory module, or a hybrid of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) card, and a hard disk drive (HDD). Examples of memory modules include a dual in-line memory module (DIMM), a small outline DIMM (SO-DIMM), and various types of non-volatile dual in-line memory modules (NVDIMMs).

The computing system 100 can be a computing device such as a desktop computer, laptop computer, server, network server, mobile computing device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device. As used herein, the term "mobile computing device" generally refers to a handheld computing device that has a slate or phablet form factor. In general, a slate form factor can include a display screen that is between approximately 3 inches and 5.2 inches (measured diagonally), while a phablet form factor can include a display screen that is between approximately 5.2 inches and 7 inches (measured diagonally). Examples of "mobile computing devices" are not so limited, however, and in some embodiments, a "mobile computing device" can refer to an IoT device, among other types of edge computing devices.

The computing system 100 can include a host system 120 that is coupled to one or more memory sub-systems 110. In some embodiments, the host system 120 is coupled to different types of memory sub-system 110. FIG. 1 illustrates one example of a host system 120 coupled to one memory sub-system 110. As used herein, "coupled to" or "coupled with" generally refers to a connection between components, which can be an indirect communicative connection or direct communicative connection (e.g., without intervening components), whether wired or wireless, including connections such as electrical, optical, magnetic, etc.

The host system 120 can include a processor chipset and a software stack executed by the processor chipset. The processor chipset can include one or more cores, one or more caches, a memory controller (e.g., an SSD controller), and a storage protocol controller (e.g., PCIe controller, SATA controller). The host system 120 uses the memory sub-system 110, for example, to write data to the memory sub-system 110 and read data from the memory sub-system 110.

The host system 120 can be coupled to the memory sub-system 110 via a physical host interface. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), Small Computer System Interface (SCSI), a double data rate (DDR) memory bus, a dual in-line memory module (DIMM) interface (e.g., DIMM socket interface that supports Double Data Rate (DDR)), Open NAND Flash Interface (ONFI), Double Data Rate (DDR), Low Power Double Data Rate (LPDDR), or any other interface. The physical host interface can be used to transmit data between the host system 120 and the memory sub-system 110. The host system 120 can further utilize an NVM Express (NVMe) interface to access components (e.g., memory devices 130) when the memory sub-system 110 is coupled with the host system 120 by the PCIe interface. The physical host interface can provide an interface for passing control, address, data, and other signals between the memory sub-system 110 and the host system 120. FIG. 1 illustrates a memory sub-system 110 as an example. In general, the host system 120 can access multiple memory sub-systems via a same communication connection, multiple separate communication connections, and/or a combination of communication connections.

The memory devices 130, 140 can include any combination of the different types of non-volatile memory devices and/or volatile memory devices. The volatile memory devices (e.g., memory device 140) can be, but are not limited to, random access memory (RAM), such as dynamic random access memory (DRAM) and synchronous dynamic random access memory (SDRAM).

Some examples of non-volatile memory devices (e.g., memory device 130) include negative-and (NAND) type flash memory and write-in-place memory, such as three-dimensional cross-point ("3D cross-point") memory device, which is a cross-point array of non-volatile memory cells. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Each of the memory devices 130, 140 can include one or more arrays of memory cells. One type of memory cell, for example, single level cells (SLC) can store one bit per cell. Other types of memory cells, such as multi-level cells (MLCs), triple level cells (TLCs), quad-level cells (QLCs), and penta-level cells (PLC) can store multiple bits per cell. In some embodiments, each of the memory devices 130 can include one or more arrays of memory cells such as SLCs, MLCs, TLCs, QLCs, or any combination of such. In some embodiments, a particular memory device can include an SLC portion, a MLC portion, a TLC portion, a QLC portion, or a PLC portion of memory cells. The memory cells of the memory devices 130 can be grouped as pages that can refer to a logical unit of the memory device used to store data. With some types of memory (e.g., NAND), pages can be grouped to form blocks.

Although non-volatile memory components such as three-dimensional cross-point arrays of non-volatile memory cells and NAND type memory (e.g., 2D NAND, 3D NAND) are described, the memory device 130 can be based on any other type of non-volatile memory or storage device, such as such as, read-only memory (ROM), phase change memory (PCM), self-selecting memory, other chalcogenide based memories, ferroelectric transistor random access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), negative-or (NOR) flash memory, and electrically erasable programmable read-only memory (EEPROM).

The memory sub-system controller 115 (or controller 115 for simplicity) can communicate with the memory devices 130 to perform operations such as reading data, writing data, or erasing data at the memory devices 130 and other such operations. The memory sub-system controller 115 can include hardware such as one or more integrated circuits and/or discrete components, a buffer memory, or a combination thereof. The hardware can include digital circuitry with dedicated (i.e., hard-coded) logic to perform the operations described herein. The memory sub-system controller 115 can be a microcontroller, special purpose logic circuitry (e.g., a field programmable gate array (FPGA), an application specific integrated circuit (ASIC), etc.), or other suitable processor.

The memory sub-system controller 115 can be a processor 117 (e.g., a processing device) configured to execute instructions stored in a local memory 119. In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120.

In some embodiments, the local memory 119 can include memory registers storing memory pointers, fetched data, etc. The local memory 119 can also include read-only memory (ROM) for storing micro-code. While the example memory sub-system 110 in FIG. 1 has been illustrated as including the memory sub-system controller 115, in another embodiment of the present disclosure, a memory sub-system 110 does not include a memory sub-system controller 115, and can instead rely upon external control (e.g., provided by an external host, or by a processor or controller separate from the memory sub-system).

In general, the memory sub-system controller 115 can receive commands or operations from the host system 120 and can convert the commands or operations into instructions or appropriate commands to achieve the desired access to the memory device 130 and/or the memory device 140. The memory sub-system controller 115 can be responsible for other operations such as wear leveling operations, garbage collection operations, error detection and error-correcting code (ECC) operations, encryption operations, caching operations, and address translations between a logical address (e.g., logical block address (LBA), namespace) and a physical address (e.g., physical block address, physical media locations, etc.) that are associated with the memory devices 130. The memory sub-system controller 115 can further include host interface circuitry to communicate with the host system 120 via the physical host interface. The host interface circuitry can convert the commands received from the host system into command instructions to access the memory device 130 and/or the memory device 140 as well as convert responses associated with the memory device 130 and/or the memory device 140 into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the memory sub-system controller 115 and decode the address to access the memory device 130 and/or the memory device 140.

In some embodiments, the memory device 130 includes local media controllers 135 that operate in conjunction with memory sub-system controller 115 to execute operations on one or more memory cells of the memory devices 130. An external controller (e.g., memory sub-system controller 115) can externally manage the memory device 130 (e.g., perform media management operations on the memory device 130). In some embodiments, a memory device 130 is a managed memory device, which is a raw memory device combined with a local controller (e.g., local controller 135) for media management within the same memory device package. An example of a managed memory device is a managed NAND (MNAND) device.

The memory sub-system 110 can include a stable state error-handling bin selection component 113. Although not shown in FIG. 1 so as to not obfuscate the drawings, the stable state error-handling bin selection component 113 can include various circuitry to facilitate various aspects of stable state error-handling bin selection. In some embodiments, the stable state error-handling bin selection component 113 can include special purpose circuitry in the form of an ASIC, FPGA, state machine, controller, processor, and/or other logic circuitry that can allow the stable state error-handling bin selection component 113 to orchestrate and/or perform operations related to stable state error-handling bin selection.

In some embodiments, the memory sub-system controller 115 includes at least a portion of the stable state error-handling bin selection component 113. For example, the memory sub-system controller 115 can include a processor 117 (processing device) configured to execute instructions stored in local memory 119 for performing the operations described herein. In some embodiments, the stable state error-handling bin selection component 113 is part of the memory sub-system 110, an application, and/or an operating system.

In a non-limiting example, an apparatus (e.g., the computing system 100) can include a memory sub-system stable state error-handling bin selection component 113. The memory sub-system stable state error-handling bin selection component 113 can be resident on the memory sub-system 110. As used herein, the term "resident on" refers to something that is physically located on a particular component. For example, the memory sub-system stable state error-handling bin selection component 113 being "resident on" the memory sub-system 110 refers to a condition in which the hardware circuitry that comprises the memory sub-system stable state error-handling bin selection component 113 is physically located on the memory sub-system 110. The term "resident on" may be used interchangeably with other terms such as "deployed on" or "located on", herein.

The memory sub-system stable state error-handling bin selection component 113 can be configured to perform or otherwise permit detection of a steady state of a memory device such as the memory device 130/140 in a memory sub-system 110 and thereby permit altering a voltage offset bin associated with a block and/or block family in the memory device 130/140. The memory sub-system stable state error-handling bin selection component 113 can, in some embodiments, detect a change in a memory control signal of a memory device including memory blocks, determine based on the change that the memory device is in a stable state, and associate a voltage offset bin with at least one memory block of the memory device in the stable state, as described herein.

As used herein, an "apparatus" can refer to various structural components. For example, the computing environment shown in FIG. 1 can be considered an apparatus. Alternatively, the memory system 110, the host 120, AND the controller 115, might each separately be considered an apparatus.

Figure 2:
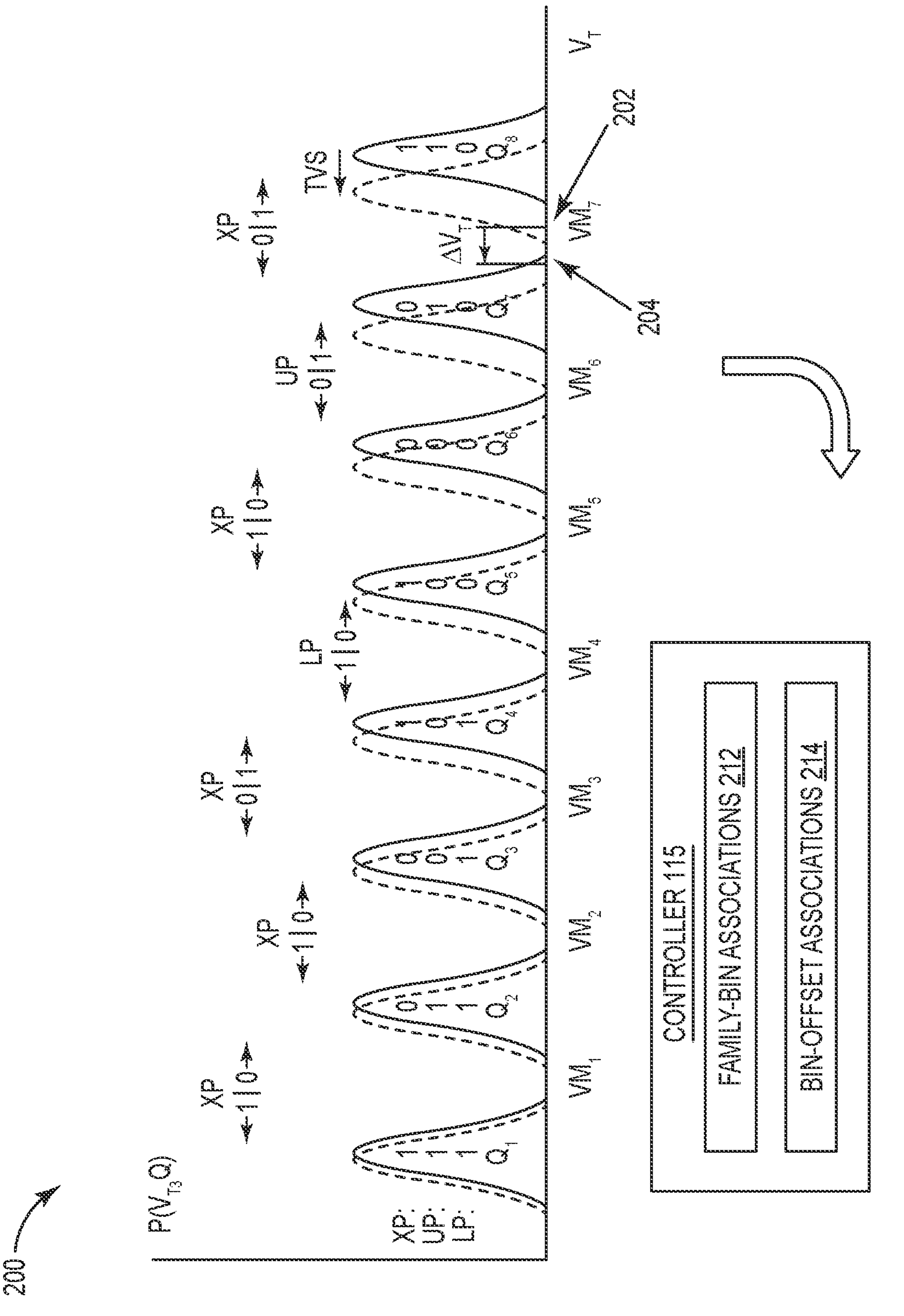
FIG. 2 illustrates schematically temporal voltage shift of a memory cell in accordance with some embodiments of the present disclosure.

FIG. 2 is a schematic 200 illustration of temporal voltage shift (TVS) of a three-level memory cell (TLC) capable of storing three bits of data by programming the memory cell into eight charge states $Q_k$, where k represent an integer from one to eight, that differ by the amount of charge on the cell's floating gate, in accordance with some embodiments of the present disclosure. The distributions of threshold voltages $P(V_T, Q_k)$ are separated with 7 valley margins $VM_n$. The cell programmed into k-th charge state ($Q_k$) can store a particular combination of 3 bits. For example, the charge state $Q_k$ can store the binary combination 101, as depicted in FIG. 2. This charge state $Q_k$ can be determined during a readout operation by detecting that a control gate voltage $V_{CG}$ within the valley margin $VM_k$ is sufficient to open the cell to the source-drain current whereas a control gate voltage within the preceding valley margin $VM_{k-1}$ is not. A memory cell can be configured to store N=1 bits (SLC), N=2 bits (MLC), N=3 bits (TLC), N=4 bits (QLC), and so on, depending on how many distributions can be fit (and interspersed with adequate-size valley margins) within the working range of the control gate voltages. Though FIG. 2 illustrates a TLC, the operations described in the disclosure can be applied to any N-bit memory cell.

Memory cells may be joined by wordlines (conducting lines electrically connected to the cells' control gates) and may be programmed together as memory pages (e.g., 16 KB or 32 KB pages) in one setting (by selecting consecutive bitlines connected to a cells' source and drain electrodes). For instance, after three programming passes, a wordline of triple-level cells can store up to three pages: lower page (LP), upper page (UP), and extra page (XP). For example, upon the first programming pass, the cell can be driven to one of the charge states $Q_1$, $Q_2$, $Q_3$, $Q_4$ (corresponding to LP bit value 1, as shown in FIG. 2) or one of the charge states $Q_5$, $Q_6$, $Q_7$, $Q_8$ (corresponding to LP bit value 0). Upon the second path, when the UP is programmed into the same wordline, the charge state of the memory cell can be adjusted so that the range of possible locations of the cell's threshold voltage is further narrowed. For example, a cell that is in one of the charge states $Q_1$, $Q_2$, $Q_3$, or $Q_4$ (LP bit value 1) can be driven to just one of the two states $Q_1$ or $Q_2$, (corresponding to UP bit value 1) or to one of the two states $Q_3$ or $Q_4$ (corresponding to UP bit value 0). Similarly, upon the third programming path, the charge state of the memory cell can be fine-tuned even more. For example, a cell that is in the logic state 10 (i.e., UP bit stores value 1 and LP bit stores value 0) and is in one of the charge states $Q_7$ or $Q_8$ can be driven to state $Q_7$ (corresponding to XP bit value 0) or to state $Q_8$ (corresponding to XP bit value 1). Conversely, during a read operation, the memory controller 115 can determine that the applied control gate voltage $V_{CG}$ within the sixth valley margin $VM_6$ is not insufficient to open the cell to the source-drain electric current whereas the control gate voltage within the seventh valley margin $VM_7$ is sufficient to open the open the cell. Hence, the memory controller 115 can determine that the cell is in the charge state $Q_7$ corresponding to the logic state 010 (i.e. XP: 0, UP: 1, LP: 0).

The distributions of threshold voltages depicted with solid lines in FIG. 2 are distributions that the memory cells have immediately after programming. With the passage of time, as a result of a slow charge loss, the distributions shift (typically, towards lower values of VT), as shown by the shifted valleys indicated with dashed lines. As a result, the threshold voltages of various memory cells are shifted by certain values $\Delta V_T$ that can depend on the time elapsed since programming, environmental conditions (e.g., ambient temperature), and so on. For optimal read operations, the controller 115 (or stable state bin selection component 113) can, therefore, adjust the base read levels with the corresponding offsets $V_R \rightarrow V_R + \Delta V$, which are the same (or approximately the same) as the temporal voltage shifts. In one embodiment, the offsets can be determined (or estimated) as the difference between the center of the valley margin (such as the center 202 of $VM_7$) immediately after programming and the center of the same—but shifted—valley margin (such as the new center 204) at some later instance of time. As depicted schematically in FIG. 2, TVS of different distributions (valleys) and valley margins can differ from each other. In a typical scenario depicted in FIG. 2, TVS is greater for larger charges Q and smaller for lesser charges.

As shown in FIG. 2, the TVS in a memory device is a continuous process. In some embodiments, however, an adequate accuracy of voltage offsets can be achieved using a discrete set of bins and, accordingly, a discrete set of voltage offsets ΔV. In such embodiments, TVS phenomenon can be addressed with setting up a number of discrete bins, e.g., five, eight, twenty, etc., associated with various memory partitions. The bin-related data can be stored in the controller 115 such as in metadata tables and/or error handling data tables. The associations of various memory partitions (grouped into families, as described in more detail below) with bins can be stored in family-bin associations 212; the family-bin associations can dynamically change with the passage of time, etc.

For example, as the memory cells continue to lose charge with time, the respective memory partitions (grouped into families) can be moved, in a consecutive fashion, from junior bins to more senior bins having larger voltage offsets. Bin-offset associations 214 can also be stored in the memory sub-system controller 115. In some embodiments, the bin-offset associations 214 can be static whereas the family-bin associations 212 can be adjusted (based on calibration of the memory partitions) to account for the actual charge loss by the memory cells of the respective partitions. In some embodiments, family-bin associations 212 can store logical addresses of the memory partitions, such as LBA of the respective blocks, while associations of LBAs with respective physical block addresses (PBA) can be stored outside the memory sub-system controller 115, e.g., in memory translations tables stored separately in the local memory 119 or one of the memory devices 130, 140. In some embodiments, however, family-bin associations 212 can additionally include LBA-to-PBA translations or store direct PBA-to-bin associations. As schematically depicted with a curved arrow in FIG. 2, the number of bins, the bin-offset associations 214, the partition-bin associations can be based upon calibration of the memory device (or similar types of memory devices, e.g., during design and manufacturing) for maximizing performance and minimizing read errors during read operations.

The threshold voltage offset depends on the time after program (TAP) and an operating state of the memory device, as described herein. As used herein, TAP is the time since a cell has been written and is the primary driver of TVS. TAP may be estimated (e.g., inference from a data state metric), or directly measured (e.g., from a controller clock). A cell, block, page, block family, etc. is young (or, comparatively, younger) if it has a (relatively) small TAP and is old (or, comparatively, older) if it has a (relatively) large TAP. A time slice is a duration between two TAP points during which a measurement may be made (e.g., perform reference calibration from 8 to 12 minutes after program, etc.). A time slice may be referenced by its center point (e.g., 10 minutes, etc.).

Blocks of the memory device are grouped into block families, such that each block family includes one or more blocks that have been programmed within a specified time window and possibly a specified temperature window. As noted herein above, since the time elapsed after programming and temperature are the main factors affecting the temporal voltage shift, all blocks and/or partitions within a single block family are presumed to exhibit similar distributions of threshold voltages in memory cells, and thus would require the same voltage offsets for read operations.

Block families can be created asynchronously with respect to block programming events. In an illustrative example, the memory sub-system controller 115 of FIG. 1 and/or the memory sub-system controller 115 can create a new block family, responsive to a power-up event, whenever a specified period of time (e.g., a predetermined number of minutes) has elapsed since creation of the last block family, and/or whenever the reference temperature of memory cells, which is updated at specified time intervals, has changed by more than a specified threshold value since creation of the current block family. For example, a new block family can be created responsive to power-up event(s) of a memory system, among other possibilities.

A newly created block family can be associated with a given bin such as bin 0. Then, the memory sub-system controller can periodically perform a calibration process in order to associate each die of every block family with one of the predefined threshold voltage offset bins, which is in turn associated with the voltage offset to be applied for read operations. The associations of blocks with block families and block families and dies with threshold voltage offset bins can be stored in respective metadata tables maintained by the memory sub-system controller.

The voltage distributions change in time due to the slow charge loss (SCL), which results in drifting values of the threshold voltage levels. In various embodiments of the present disclosure, the temporal voltage shift is selectively tracked for programmed blocks grouped by block families, and appropriate voltage offsets, which are based on block affiliation with a certain block family, are applied to the base read levels in order to perform read operations.

Figure 3:
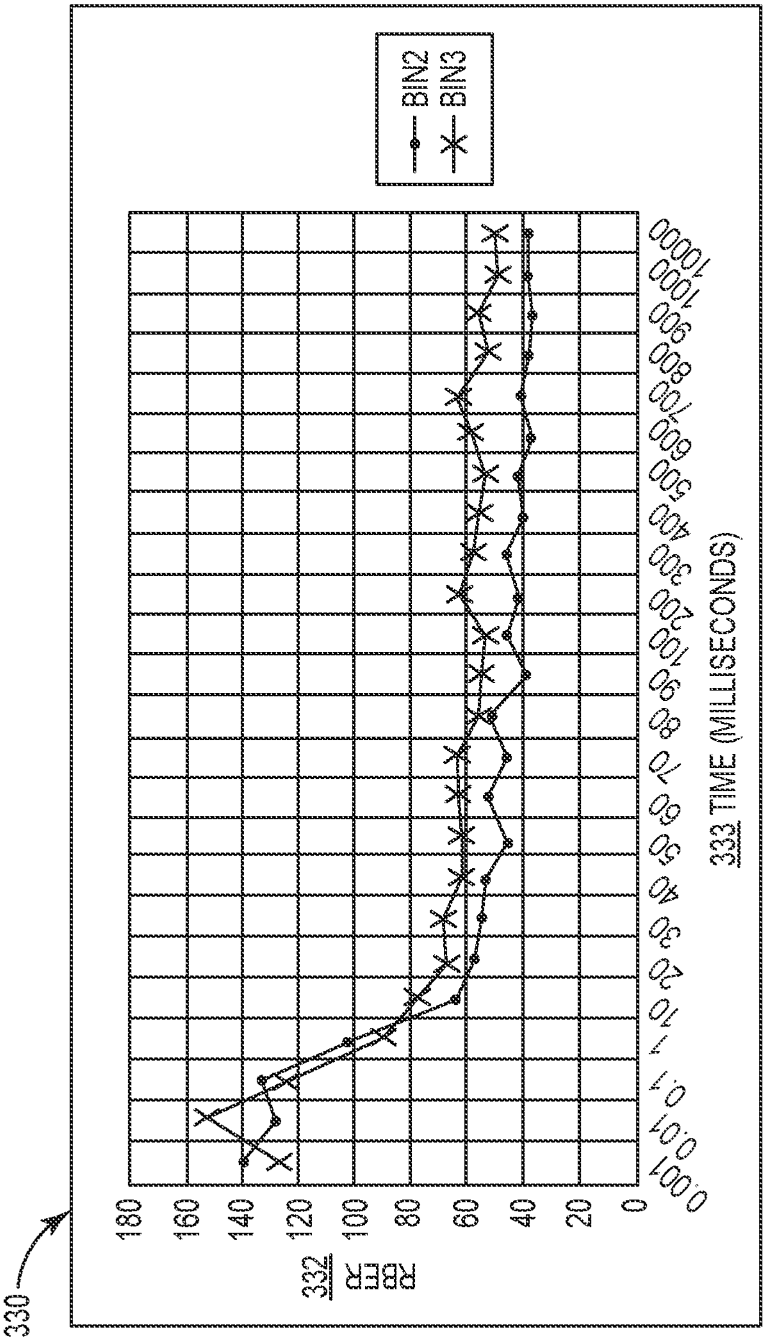
FIG. 3 illustrates an example graph illustrating examples of stable state error-handling bin selection in memory devices in accordance with some embodiments of the present disclosure.

FIG. 3 illustrates an example graph 330 illustrating an example of stable state error-handling bin selection in memory devices in accordance with some embodiments of the present disclosure. The graph 330 illustrates changes in raw bit error rate (RBER) (as shown along a first axis 332) over time (as shown along a second axis 333). At time 0, a memory system power-up event can occur. As illustrated in FIG. 3, subsequent to occurrence of the power-up event the RBER can initially be relatively high (e.g., from about 0.1 milliseconds to about 1 millisecond seconds after the power-up event). The RBER can then diminish until the memory system reaches a stable state (e.g., at about 10 milliseconds after the power-up event), as illustrated in FIG. 3.

As illustrated in FIG. 3, the bin that is selected based solely on RBER at a given time can vary. For instance, shortly after the power-up event (e.g., from about 0.1 milliseconds to about 1 millisecond after the power-up event) bin 3 can have a lower associated RBER. However, during the stable state (e.g., about 10 milliseconds or more after the power-up event) bin 2 can have a lower associated RBER. However, as mentioned a given bin (e.g., bin 2) selected based on an associated RBER during the stable state may not be suitable for subsequent operation of the memory device during a transient state (e.g., at which the memory device may typically operate). Accordingly, approaches herein can determine the memory device is in a stable state and select an appropriate bin (e.g., a higher) bin than a bin (e.g., bin 2) that would otherwise be selected solely based on the associated RBER during the stable state, as detailed herein. For instance, the voltage offset bin (e.g., bin 3) can be associated with at least one memory block of the memory device in the stable state that is the same as a voltage offset bin (e.g., bin 3) that would otherwise be associated with the at least one block of the memory device when the memory device is in a transient state. Thus, approaches herein can yield a reduced error rate (e.g., reduced RBER) during subsequent operation in a transient state and thereby account for the memory system being in a stable state.

Figure 4:
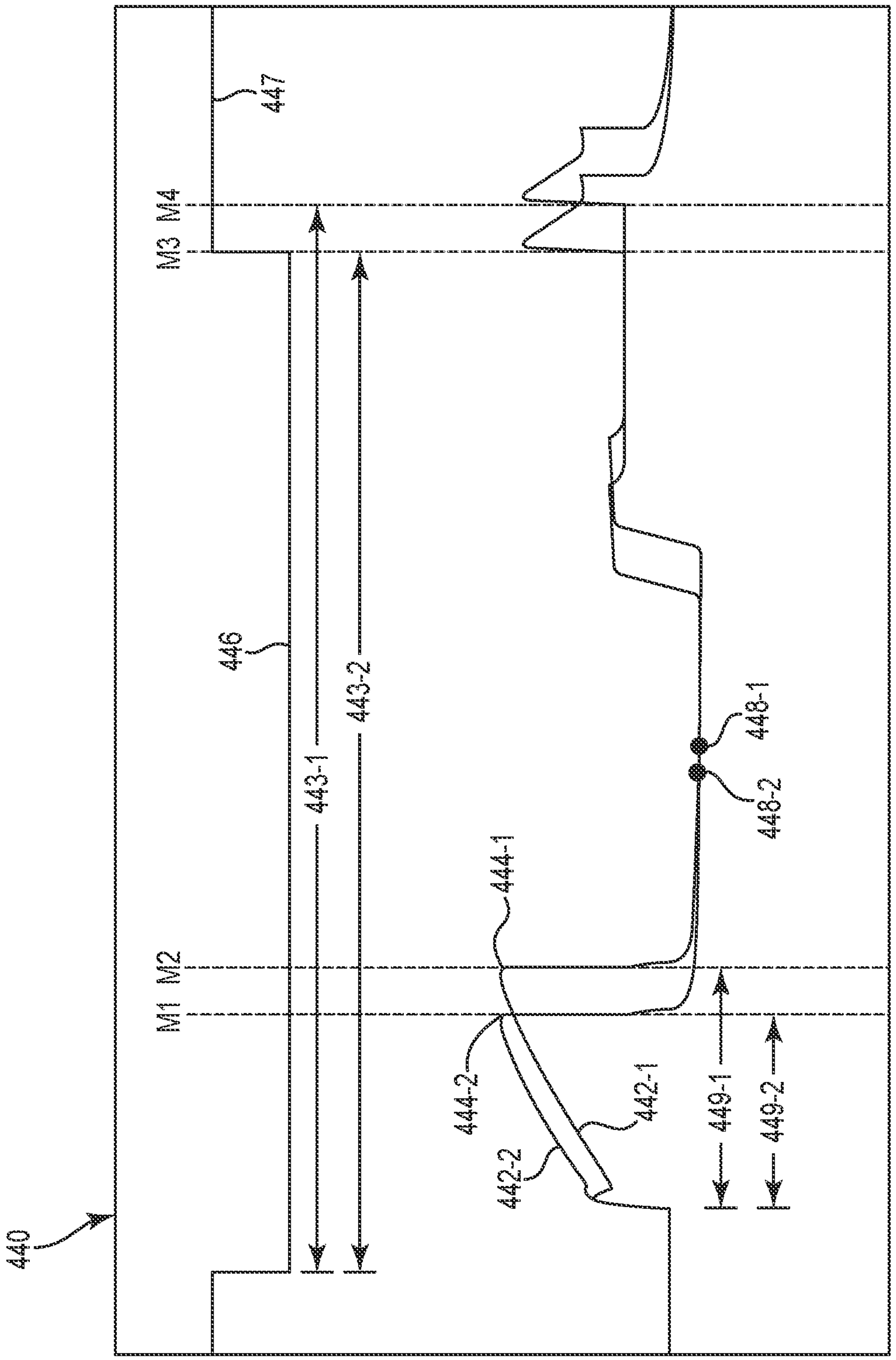
FIG. 4 illustrates an example graph relating to stable state detection in accordance with some embodiments of the present disclosure.

FIG. 4 illustrates an example graph 440 relating to stable state detection in accordance with some embodiments of the present disclosure. The graph 440 schematically illustrates values of memory control signals over time. The memory control signal can be a read/busy (RB) signal, a pass voltage (VpassR) signal, or both. The RB signal can be associated with the memory sub-system (e.g., the memory sub-system 110 as illustrated in FIG. 1), the memory sub-system controller (e.g., the memory sub-system controller 115 as illustrated in FIG. 1) and/or a memory device (e.g., the memory device 130 and/or 140 as illustrated in FIG. 1). The VpassR signal can associated with a memory device (e.g., the memory device 130 and/or 140 as illustrated in FIG. 1)

A change in the memory control signal can be detected. For instance, a RB signal can be polled by a controller to determine a current RB signal state and/or any change in the RB signal state. In some embodiments, the RB signal can be polled during a first BFEA scan responsive to a power-up event. Polling of the RB signal can occur periodically such as polling a at given (fixed) interval. For instance, the RB signal can be polled periodically every 0.5 microseconds, among other possibilities. Polling periodically at a given interval can yield a status of the RB signal over a period of time (e.g, for a quantity of counts at which the RB signal remains in a given signal state).

For instance, as illustrated in FIG. 4, a first RB signal 442-1 can be periodically polled to determine an amount of time (e.g., a first time 443-1) that the first RB signal 442-1 is in a given signal state (e.g., a high signal state or a low signal state). For example, the first RB signal 442-1 can be periodically polled to determine the amount of time (e.g., the first time 443-1) that the first RB signal 442-1 remains in a low state (represented by 446 in FIG. 4) prior to the first RB signal 442-1 changing to the high signal state (represented by 447 in FIG. 4). Similarly, as illustrated in FIG. 4, a second RB signal 442-2 can be polled periodically to determine an amount of time (represented by 443-2) that the second RB signal 442-2 is in a given signal state. For example, the second RB signal 442-2 can be polled to determine an amount of time (represented by 443-2) that the second RB signal 442-2 remains in a low state (446).

It is noted that the first RB signal and second RB signal are described herein for purposes of illustrating the concepts herein and is not intended to require that two separate RB signals must be present. Rather, the first RB signal and the second RB signals refer to two RB signals associated with a multiplane read in the memory device illustrating the difference between a given plane in a stable state and another plane in a transient state. Additionally, while described generally herein as determining an amount of time that a memory control signal is in a given state, it is understood that an exact amount of time (e.g, a quantity of microseconds) is not required and rather that an approximation of the amount of time and/or a quantity of counter counts may instead be employed.

Determination of the amount of time that the memory control signal is in a given state can permit determination of whether the memory device is in a stable state or a transient state. For instance, the first time 443-1 is longer than the second time 443-2. The first time 443-1 may be longer due to the memory device having a longer voltage ramp time (e.g., as represented by a first voltage ramp time 448-1) when the memory device is in a stable state as compared to a voltage ramp time (as represented by a second voltage ramp time 448-2 in FIG. 4) when the memory device is in a transient state. That is, when performing a memory operation involving the memory device the ramp time (e.g., a time to achieve a threshold voltage 444-1, 444-2 on a word line) can vary depending on the given operational state of the memory device.

In some embodiments, the memory control signal can be a VpassR signal. In such embodiments, a change in a VpassR signal can be detected. In some embodiments, the stable state is determined based on a time to ramp the VpassR signal from a first signal state to a second state. For instance, the first signal state may correspond to an initial pass voltage, and wherein the second signal state may correspond to a final pass voltage, as illustrated in FIG. 4.

In some embodiments, the change in the VpassR signal can be determined via polling and/or incrementing of a counter that is associated with the VpassR signal. For instance, a controller can cause a counter included in a memory device to increment responsive to the VpassR signal being at the first signal state and can cause the counter to cease incrementing responsive to the VpassR signal being at the second state. A quantity of the counts (that occurred between the first signal state and the second signal state) can be compared to corresponding count values in a look-up table or other data structure to determine whether the memory device is in a stable state or a transient state. As mentioned, higher counts (or longer VpassR ramp times) may generally correspond to a stable state while fewer counts (or shorter VpassR ramp times) may generally correspond to a transient state of the memory device.

For instance, as illustrated in FIG. 4, a first VpassR signal 449-1 can have a duration (to change from a first signal state to a second signal state) that is longer (e.g., has a corresponding quantity of counts that is greater than) than a duration of the second VpassR signal 449-2. Thus, the time and/or quantity of counts associated with the first VpassR signal 449-1 changing from the first signal state to the second state may correspond in a look-up table or other data structure to the memory device being in a stable state. Conversely, the time and/or quantity of counts associated with the second VpassR signal 449-2 changing from the first signal state to the second state may correspond in the look-up table or other data structure to the memory device being in a transient state.

The memory system can take longer to reach a given operational voltage (e.g., achieve a given VpassR voltage) when in a stable state as compared to when the memory system is in a transient state. For instance, a voltage ramp time of a VpassR voltage associated with a memory device in a stable state may be longer (e.g., about 2-3 microseconds and/or about 4-6 RB signal polls more) than a ramp time of the VpassR voltage when the memory device is at the same environmental and same operational conditions (e.g., same Vcc) but is in a transient state. As such, approaches herein can utilize the difference in tR (e.g., as determined based on a given RB signal change and/or based on the VpassR signal change) to determine whether the memory device is in a stable state or a transient state and thereby select an appropriate bin (e.g., to reduce RBER).

Accordingly, an operational state of the memory system can be determined by comparison of the given RB signal change and/or based on the VpassR signal change to values in a look-up table or other data structure. longer times or higher counts may correspond to a stable state while relatively shorter times or fewer counts may correspond to a transient state. For instance, the amount of time the RB signal is in a given state can be compared to time values in a look-up table or other types of data structure that respectively correspond to a given operating state of the memory device. The look-up table or other types of data structure can be stored in the memory controller, in the memory devices, and/or can be otherwise accessible by the memory subsystem.

In some embodiments, the look-up table can store respective count values and corresponding operational states for each memory die of the memory dies included in a memory device. That is, any variation between memory dies can be accounted for by having respective count values and corresponding operational states for each memory die in the memory device. For instance, in some embodiments, each memory die can have a respective look-up table storing respective count values and corresponding operational states (e.g., a stable state) for the memory die.

In some embodiments, the time values and/or count values in the look-up table can account for various environmental and/or operational factors such as an temperature of the memory system, an ambient temperature surrounding the memory system, a voltage (e.g., Vcc) supplied to the memory system, etc. Thus, reliable determination of whether the memory device is in a stable state or transient state may occur even with variations in environmental and/or operational factors associated with the memory system.

Figure 5:
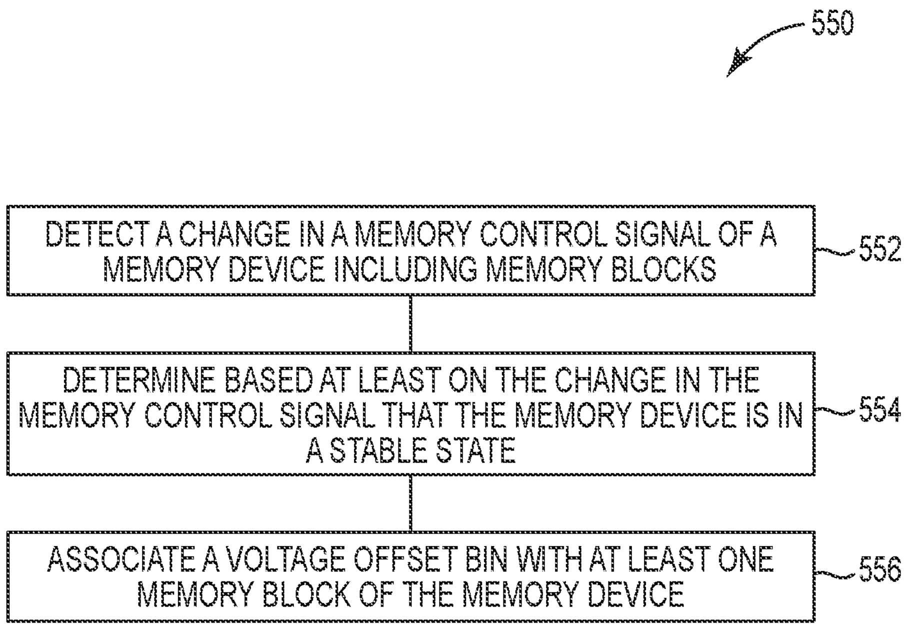
FIG. 5 is a flow diagram corresponding to a method of stable state error-handling bin selection in memory devices in accordance with some embodiments of the present disclosure.

FIG. 5 is a flow diagram 550 corresponding to a method of stable state error-handling bin selection in memory devices in accordance with some embodiments of the present disclosure. The method 550 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 550 is performed by the stable state error-handling bin selection component 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At 552, the method can detect a change in a memory control signal of a memory device including memory blocks. For instance, a change in a RB signal, a VpassR signal, or both can be detected, as described herein. The change in the memory control signal can be determined by a controller periodically polling or otherwise determining a given signal status (e.g., high, low, etc.) of the memory control signal. Thus, a duration (e.g., based on a quantity of counts of a counter) that the memory control signal is at a given state and/or duration of time that the memory control signal takes to change from a first signal state to a second signal state can be determined, as described herein. In some embodiments, the change in the memory control signal can be detected responsive to detection of a power-up event of the memory device such as power-up event following a power loss event.

The change in the memory control signal can be utilized to determine an operational state of the memory device. For instance, at 554, the memory device can be determined to be in a stable state based at least on the change in the memory control signal. For instance, the quantity of counts associated with the change in the memory control signal (e.g., a quantity of counts of a counter that is incremented while the memory control signal is in a given signal state) can be compared to count values in a look-up table to determine that the memory device is in a stable state, as described herein.

At 556, a voltage offset bin can be associated with at least one memory block of the memory blocks of the memory device. For instance, a voltage offset bin can be associated with at least one memory block of the memory device responsive to a determination that the memory device is in a stable state. A look-up table or other data structure can be employed (e.g., by a controller) to determine which bin to associate with the at least one memory block of the memory device in the stable state. In some embodiments, the voltage offset bin associated with the at least one memory block of the memory device in the stable state may be an immediately adjacent bin (e.g., bin 3) that is higher than a voltage offset bin (e.g., bin 2) than would otherwise be associated with the at least one memory block in the absence of accounting for the stable state (e.g., based solely on a resultant RBER associated with a given bin when in the stable state).

In some embodiments, the memory sub-system controller can associate each die of every block family with a threshold voltage offset bin, which defines a set of threshold voltage offsets to be applied to the base voltage read level to perform read operations, as described in more detail herein below. For instance, the memory controller can determine whether the memory system is in a transient state or stable state and associate a bin with a block family based on whether the memory system is in a transient state or stable state, as detailed herein. In some embodiments, the voltage offset bin can be associated with at least one memory block of the memory device subsequent to a power-up event involving the memory device and prior to performing any host initiated memory operations involving the memory device that has been powered-up.

Figure 6:
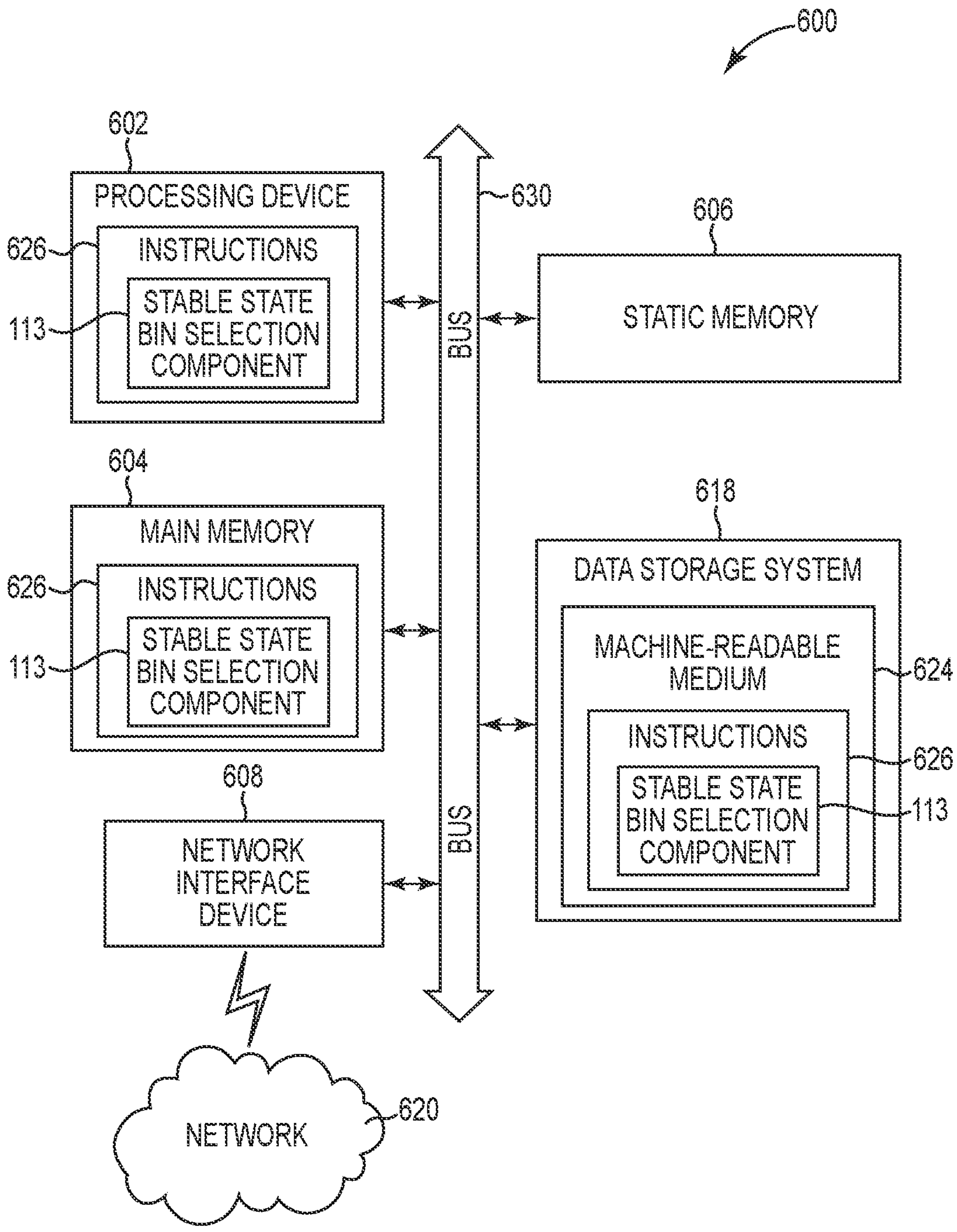
FIG. 6 is a block diagram of an example computer system in which embodiments of the present disclosure may operate.

FIG. 6 is a block diagram of an example computer system in which embodiments of the present disclosure may operate. For example, FIG. 6 illustrates an example machine of a computer system 600 within which a set of instructions, for causing the machine to perform any one or more of the methodologies discussed herein, can be executed. In some embodiments, the computer system 600 can correspond to a host system (e.g., the host system 120 of FIG. 1) that includes, is coupled to, or utilizes a memory sub-system (e.g., the memory sub-system 110 of FIG. 1) or can be used to perform the operations of a controller (e.g., to execute an operating system to perform operations corresponding to the stable state error-handling bin selection component 113 of FIG. 1). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 600 includes a processing device 602, a main memory 604 (e.g., read-only memory (ROM), flash memory, dynamic random access memory (DRAM) such as synchronous DRAM (SDRAM) or Rambus DRAM (RDRAM), etc.), a static memory 606 (e.g., flash memory, static random access memory (SRAM), etc.), and a data storage system 618, which communicate with each other via a bus 630.

The processing device 602 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. The processing device 602 can also be one or more special-purpose processing devices such as an application specific integrated circuit (ASIC), a field programmable gate array (FPGA), a digital signal processor (DSP), network processor, or the like. The processing device 602 is configured to execute instructions 626 for performing the operations and steps discussed herein. The computer system 600 can further include a network interface device 608 to communicate over the network 620.

The data storage system 618 can include a machine-readable storage medium 624 (also known as a computer-readable medium) on which is stored one or more sets of instructions 626 or software embodying any one or more of the methodologies or functions described herein. The instructions 626 can also reside, completely or at least partially, within the main memory 604 and/or within the processing device 602 during execution thereof by the computer system 600, the main memory 604 and the processing device 602 also constituting machine-readable storage media. The machine-readable storage medium 624, data storage system 618, and/or main memory 604 can correspond to the memory sub-system 110 of FIG. 1.

In one embodiment, the instructions 626 include instructions to implement functionality corresponding to a stable state error-handling bin selection component (e.g., the stable state error-handling bin selection component 113 of FIG. 1). While the machine-readable storage medium 624 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMS, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory devices, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A method comprising:

detecting, using a controller of a memory sub-system, a change in a memory control signal of a memory device of the memory sub-system;

determining a quantity of counts of a counter associated with the change in the memory control signal;

comparing the quantity of counts of the counter to count values in a data structure;

determining, based at least on the comparison, that the memory device is in a stable state; and responsive to determining that the memory device is in the stable state, associating a voltage offset bin with at least one memory block of the memory device;

wherein the voltage offset bin associated with at least one memory block of the memory device in the stable state is the same as a voltage offset bin that is associated with the at least one memory block of the memory device when the memory device is in a transient state.

2. The method of claim 1, wherein the memory control signal comprises a read/busy (RB) signal.

3. The method of claim 2, wherein the stable state is determined based on a duration that the RB signal is at a given signal state.

4. The method of claim 3, wherein the given state corresponds to a low signal state.

5. The method of claim 1, further comprising:

associating the voltage offset bin with the at least one memory block of the memory blocks by performing a temporal voltage shift (TVS)-oriented calibration.

6. The method of claim 1, further comprising associating the voltage offset bin with the at least one memory block of the memory device while the memory device is in the stable state.

7. The method of claim 1, wherein the memory control signal comprises a pass voltage (VpassR) signal.

8. The method of claim 7, wherein the stable state is determined based on an amount of time to ramp the VpassR signal from a first signal state to a second signal state.

9. The method of claim 8, wherein the first signal state further comprises an initial pass voltage, and wherein the second signal state further comprises a final pass voltage.

10. The method of claim 8, further comprising a counter that is configured to increment responsive to the VpassR signal being at the first signal state and cease incrementing responsive to the VpassR signal being at the second signal state.

11. An apparatus, comprising:

a memory sub-system including a memory device and a controller, the controller including a stable state error-handling bin selection component configured to:

detect a change in a memory control signal of the memory device;

determine a quantity of counts of a counter associated with the change in the memory control signal;

compare the quantity of counts of the counter to count values in a data structure;

determine based on the comparison that the memory device is in a stable state; and responsive to determining that the memory device is in the stable state, associate a voltage offset bin with at least one memory block of the memory device;

wherein the voltage offset bin associated with the at least one memory block of the memory device in the stable state is the same as a voltage offset bin that is associated with the at least one memory block of the memory device when the memory device is in a transient state.

12. The apparatus of claim 11, wherein the stable state error-handling bin selection component is further configured to associate the voltage offset bin with the at least one memory block of the memory device subsequent to a power-up event and prior to performing any host initiated memory operations involving the memory device.

13. The apparatus of claim 11, wherein the stable state error-handling bin selection component is further to determine that the memory device is in the stable state and associate the voltage offset bin with the at least one memory block of the memory device in the absence of a dummy read involving the memory device.

14. The apparatus of claim 13, wherein the stable state error-handling bin selection component is further to associate the voltage offset bin with the at least one memory block of the memory device in the absence of the dummy read.

15. An apparatus, comprising:

a memory sub-system including a memory device having a plurality of memory dies; and a controller configured to:

detect, over a period of time, a change in a memory control signal of the memory device;

determine a quantity of counts of a counter that is incremented periodically over the period of time;

determine based at least on the quantity of counts that the memory device is in a stable state; and responsive to the determination that the memory device is in the stable state, associate a voltage offset bin with at least one memory block of the memory device while the memory device is in the stable state; and perform a memory operation involving the at least one memory block of the memory device subsequent to associating the voltage offset bin with the at least one memory block of the memory device;

the apparatus further comprising a look-up table storing a plurality of count values and corresponding operational states of the memory device, wherein the corresponding operational states include the stable state and a transient state.

16. The apparatus of claim 15, wherein the controller is configured to detect the change in the memory control signal responsive to detection of an occurrence of a power-up event associated with the memory device.

17. The apparatus of claim 15, wherein the controller is configured to determine, based at least on the quantity of counts, that the memory device is in the stable state by determining that the quantity of counts of the counter correspond in the look-up table to the stable state.

18. The apparatus of claim 15, wherein the look-up table stores respective count values and corresponding operational states for each memory die of the plurality of memory dies.

* * * * *